United States Patent
Chou

(10) Patent No.: US 8,994,049 B2
(45) Date of Patent: Mar. 31, 2015

(54) LIGHT EMITTING COMPONENT AND MANUFACTURING METHOD THEREOF

(75) Inventor: His-yan Chou, Taoyuang (TW)

(73) Assignee: Interlight Optotech Corporation, Yangmei, Taoyuan County (TW)

( * ) Notice: Subject to any disclaimer, the term of this patent is extended or adjusted under 35 U.S.C. 154(b) by 1101 days.

(21) Appl. No.: 13/012,919

(22) Filed: Jan. 25, 2011

(65) Prior Publication Data

US 2012/0068210 A1    Mar. 22, 2012

(30) Foreign Application Priority Data

Sep. 20, 2010  (TW) ............................. 99131899 A

(51) Int. Cl.
  H01L 25/075   (2006.01)
  H01L 27/15    (2006.01)
  H01L 33/62    (2010.01)
  H01L 33/50    (2010.01)

(52) U.S. Cl.
  CPC ........... *H01L 25/0753* (2013.01); *H01L 27/153* (2013.01); *H01L 33/50* (2013.01)
  USPC .......................................................... 257/98

(58) Field of Classification Search
  CPC .... H01L 25/0753; H01L 27/153; H01L 33/50
  See application file for complete search history.

(56) References Cited

U.S. PATENT DOCUMENTS

| 4,322,735 | A * | 3/1982 | Sadamasa et al. ............... 257/89 |
| 8,314,431 | B2  | 11/2012 | Heidborn et al. |
| 2008/0284315 | A1 * | 11/2008 | Tasumi et al. .................. 313/503 |
| 2009/0109151 | A1 * | 4/2009 | Kim et al. ......................... 345/83 |
| 2010/0072919 | A1 * | 3/2010 | Wei et al. ......................... 315/294 |
| 2010/0103660 | A1 | 4/2010 | van de Ven et al. |
| 2010/0322669 | A1 * | 12/2010 | Takeuchi et al. ............... 399/221 |
| 2011/0156616 | A1 * | 6/2011 | Anderson et al. ............. 315/312 |

FOREIGN PATENT DOCUMENTS

| CN | 101246876 A | 8/2008 |
| KR | 100529591 B1 | 11/2005 |
| TW | 200824155 A | 6/2008 |
| TW | 201025557 A1 | 7/2010 |

OTHER PUBLICATIONS

China Official Action issued on Feb. 5, 2013.

* cited by examiner

*Primary Examiner* — Shaun Campbell
*Assistant Examiner* — Raj R Gupta
(74) *Attorney, Agent, or Firm* — Muncy, Geissler, Olds & Lowe, P.C.

(57) ABSTRACT

A light emitting component, and more particularly to a white light emitting component with high light emitting efficiency are provided. The white light emitting component with high light emitting efficiency has properties of high driving voltage, high color render index and concentrated optical density. The light emitting component includes a plurality of different light emitting diode chip groups for emitting a number of lights in different wavelength ranges and a wavelength conversion fluorescent material. A manufacturing method by stacking miniature light emitting diode chip groups to form the white light emitting component is also provided.

13 Claims, 16 Drawing Sheets

LIGHT EMITTING COMPONENT AND MANUFACTURING METHOD THEREOF

FIELD OF THE INVENTION

The present invention relates to a light emitting component and a manufacturing method thereof, and more particularly to a white light emitting component with high light emitting efficiency and a manufacturing method by stacking miniature light emitting diode groups to form the white light emitting component. The white light emitting component with high light emitting efficiency has properties of high driving voltage, high color render index (CRI) and concentrated optical density.

BACKGROUND OF THE INVENTION

FIG. 1 illustrates a schematic view of a white light emitting component disclosed in U.S. Pat. No. 5,998,925. Referring to FIG. 1, a white light emitting component 1 includes a casing 11, a gallium nitride compound light emitting diode chip that is capable of emitting a blue light, and a fluorescent material 13. The fluorescent material 13 is mixed into the coating resin 14 and is configured for absorbing a part of the blue light emitting from the gallium nitride compound light emitting diode chip to emit a green light. Thus, the blue light and the green light are mixed to form a white light to output.

FIG. 2 illustrates a spectrogram of a white light emitting component with high color render index disclosed in U.S. Pat. No. 5,851,063. Referring to FIG. 2, the white light emitting component includes a light emitting diode for emitting a light in the blue wavelength range (455-490 nm), a light emitting diode for emitting a light in the green wavelength range (530-570 nm) and a light emitting diode for emitting a light in the red wavelength range (605-630 nm). The white light emitting component having an optimized color render index (e.g., the color render index is more than 80) can be achieved by selecting a suitable chromaticity of the wavelength range of each of the three light emitting diodes.

Additionally, U.S. Pat. No. 6,351,069 discloses a white light emitting component with high color render index and uniform chromaticity. The white light emitting component includes a light emitting diode for emitting a blue light and two fluorescent materials. The light emitting diode for emitting the blue light is, for example, a gallium nitride based light emitting diode chip. The two fluorescent materials are configured for absorbing a part of the blue light to emit a green light and a red light respectively. The blue light, the green light and the red light with different wavelength are mixed to form a white light to output. Thus, the white light emitting component with high color render index and uniform chromaticity can be obtained.

FIG. 3 illustrates a schematic view of a white light emitting component with high color render index and high light emitting efficiency disclosed in U.S. Pat. No. 6,234,648. Referring to FIG. 3, in order to overcome the shortcomings of the above-mentioned white light emitting components, a white light emitting component 20 includes a gallium nitride based light emitting diode 21 for emitting a blue light, a light emitting diode 22 for emitting a red light, and a fluorescent material 23. The fluorescent material 23 is capable of absorbing a part of the blue light emitting from the gallium nitride based light emitting diode 21 to emit a green light. The blue light, the green light and the red light with different wavelength are mixed to form a white light to output. Thus, the white light emitting component with high color render index and high light emitting efficiency can be obtained.

FIG. 4 illustrates a schematic view of a light emitting device disclosed in U.S. application 20090109151. Referring to FIG. 4, in order to increase the color render index of a white light emitting component driven by an alternating current (AC) power, a white light emitting device 40 includes two groups of light emitting diodes driven by the AC power 41, 42 and a coating resin mixed with a fluorescent material 43. The two groups of light emitting diodes driven by the AC power 41, 42 can emit two different lights. In a first example, the white light emitting device 40 can includes a group of light emitting diodes driven by the AC power for emitting a blue light and a group of light emitting diodes driven by the AC power for emitting a green light. The coating resin is mixed with a fluorescent material for emitting a red light, and is disposed on the group of light emitting diodes driven by the AC power for emitting the blue light.

In a second example, the white light emitting device 40 can includes a group of light emitting diodes driven by the AC power for emitting a blue light and a group of light emitting diodes driven by the AC power for emitting a red light. The coating resin mixed with a fluorescent material for emitting a light in a wavelength range between the blue light wavelength and the green light wavelength. The coating resin is disposed on the group of light emitting diodes driven by the AC power for emitting the blue light. U.S. application 20090109151 discloses a method to increase the color render index. However, the light conversion efficiency of the fluorescent material that absorbs the blue light to emit the red light (600-630 nm) is still low. Thus, although the first example can increase the color render index of the white light emitting device, the light emitting efficiency of the white light emitting device can not be increased effectively. Although the second example can increase the color render index of the white light emitting device effectively and can avoid the decrease of the light emitting efficiency of the light emitting device, the light emitting diodes driven by the AC power for emitting the blue light and the light emitting diodes driven by the AC power for emitting the red light are separately disposed.

Therefore, a light emitting component with high light emitting efficiency as well as properties of high driving voltage, high color render index (CRI) and concentrated optical density is desirous.

SUMMARY OF THE INVENTION

The disclosure provides a light emitting component that is a white light emitting component with high light emitting efficiency and has properties of high driving voltage, high color render index and concentrated optical density.

The disclosure also provides a manufacturing method by stacking a number of miniature light emitting diodes chips to form a white light emitting component with high light emitting efficiency. The manufactured light emitting component has properties of high driving voltage, high color render index and concentrated optical density.

The disclosure provides a light emitting component including a leadframe, a first insulating substrate, a first light emitting diode chip group, a second light emitting diode chip group and a wavelength conversion fluorescent material. The first insulating substrate is disposed on the leadframe. The first insulating substrate includes a first region and a second region. The first light emitting diode chip group is disposed on the first insulating substrate and is located in the first region. The first light emitting diode chip group is configured for emitting a first light. The second light emitting diode chip group is disposed on the first insulating substrate and in the second region. The second light emitting diode chip group is configured for emitting a second light. The wavelength conversion fluorescent material is disposed on the first light emitting diode chip group and the second light emitting diode chip group. The wavelength conversion fluorescent material is configured for absorbing a part of the first light emitting from the first light emitting diode chip group to emit a third light. A wavelength range of the first light, a wavelength range of the second light and a wavelength range of the third light are different.

In one embodiment, the first light emitting diode chip group includes a number of miniature AlInGaN-based light emitting diode chips, the miniature aluminum indium gallium nitride based (AlInGaN-based) light emitting diode chips are electrically connected to each other in series. The second light emitting diode chip group includes a number of miniature AlInGaPN-based light emitting diode chips, the miniature AlInGaPN-based light emitting diode chips are electrically connected to each other in series. The wavelength range of the first light is in a blue wavelength range from 430 to 490 nanometers, the wavelength range of the second light is in a red wavelength range from 605 to 650 nanometers, and the wavelength range of the third light is in a yellow-green wavelength range from 550 to 590 nanometers.

In one embodiment, the second region is selected from a group consisting of a center region of the first insulating substrate, four corner regions of the first insulating substrate and four periphery regions the first insulating substrate.

In one embodiment, the light emitting component further includes a second insulating substrate disposed between the first insulating substrate and the second light emitting diode chip group.

In one embodiment, the light emitting component further includes a reflective layer disposed either below the first insulating substrate or between the first insulating substrate and the second light emitting diode chip group.

In one embodiment, the first light emitting diode chip group is electrically connected to the second light emitting diode chip group.

In one embodiment, the light emitting component further includes a number of metal pads disposed on the first insulating substrate. The metal pads are configured for serving as flip-chip bonding pads when the second light emitting diode chip group is disposed on the first insulating substrate in a flip-chip manner.

In one embodiment, the light emitting component further includes an AlInGaN-based epitaxial layer disposed between the first insulating substrate and the second insulating substrate.

In one embodiment, the light emitting component further includes an insulating layer disposed on the AlInGaN-based epitaxial layer and a number of metal pads disposed on the insulating layer. The metal pads are configured for serving as flip-chip bonding pads when the second light emitting diode chip group is disposed on the first insulating substrate in a flip-chip manner.

In one embodiment, the light emitting component further includes a reflective layer disposed between the insulating layer and between the insulating layer and the second light emitting diode chip group.

In one embodiment, the light further includes a coating resin. The wavelength conversion fluorescent material is mixed into the coating resin. The coating resin mixed with the wavelength conversion fluorescent material is disposed either on the first light emitting diode chip group uniformly or on the first light emitting diode chip group and the second light emitting diode chip group uniformly.

In one embodiment, the wavelength conversion fluorescent material is selected from a group consisting of $Sr_{1-x-y}Ba_xCa_y$-$SiO_4:Eu^{2+}F$; $(Sr_{1-x-y}Eu_xMn_y)P_{2+z}O_7:Eu^{2+}F$; $(Ba, Sr, Ca)Al_2O_4:Eu$; $((Ba, Sr, Ca)(Mg, Zn))Si_2O_7:Eu;SrGa_2S_4:Eu$; $((Ba, Sr, Ca)_{1-x}Eu_x)(Mg, Zn)_{1-x}Mn_x)Al_{10}O_{17}$; $Ca_8Mg(SiO_4)_4Cl_2:Eu, Mn$; $((Ba, Sr, Ca, Mg)_{1-x}Eu_x)_2Si_2O_4$; $Ca_2MgSi_2O_7$:Cl; $SrSi_3O_8.2SrCl_2:Eu$; BAM:Eu; Sr-Aluminate:Eu; Thiogallate:Eu; Chlorosilicate:Eu; Borate:Ce, Tb;$Sr_4Al_{14}O_{25}:Eu$; $YBO_3$:Ce, Tb; $BaMgAl_{10}O_{17}:Eu, Mn$; $(Sr, Ca, Ba)(Al, Ga)_2S_4:Eu$; $Ca_2MgSi_2O_7:Cl, Eu, Mn$; $(Sr, Ca, Ba, Mg)_{10}(PO4)_{6(c)}l_2:Eu$; ZnS:Cu, Al; $(Y, Gd, Tb, Lu, Yb)(Al_yGa_{1-y})_5O_{12}$:Ce; $(Sr_{1-x-y-z}Ba_xCa_yEu_z)_2SiO_4$; $(Sr_{1-a-b}Ca_bBa_c)Si_xN_yO_z:Eu_a$; $Sr_5(PO_4)_3Cl:Eu_a$ and a combination of the aforesaid compounds.

The disclosure also provides a manufacturing method of a light emitting component. In the method, at first, a first insulating substrate is disposed on a leadframe. The first insulating substrate includes a first region and a second region. Then, a first light emitting diode chip group is disposed on the first insulating substrate and located in the first region. The first light emitting diode chip group is configured for emitting a first light. Thereafter, a second light emitting diode chip group is disposed on the first insulating substrate and located in the second region. The second light emitting diode chip group is configured for emitting a second light. Afterwards, a wavelength conversion fluorescent material is disposed on the first light emitting diode chip group and the second light emitting diode chip group. The wavelength conversion fluorescent material is configured for absorbing a part of the first light emitting from the first light emitting diode chip group to emit a third light. A wavelength range of the first light, a wavelength range of the second light and a wavelength range of the third light are different.

In one embodiment, the step of disposing the first light emitting diode chip group includes forming an AlInGaN-based epitaxial layer on the first insulating substrate; and processing the AlInGaN-based epitaxial layer to forming a number of miniature AlInGaN-based light emitting diode chips. The miniature AlInGaN-based light emitting diode chips are electrically connected to each other in series so as to form the first light emitting diode chip group. The first light is in a blue wavelength range from 430 to 490 nanometers.

In one embodiment, the method further includes removing a portion of the AlInGaN-based epitaxial layer in the second region.

In one embodiment, the second light emitting diode chip group is disposed on the first insulating substrate in a flip-chip manner.

In one embodiment, the step of disposing the second light emitting diode chip group further includes forming an AlInGaPN-based epitaxial layer on the second insulating substrate and processing the AlInGaPN-based epitaxial layer to form a plurality of miniature AlInGaPN-based light emitting diode chips. The miniature AlInGaPN-based light emitting diode chips are electrically connected to each other in series so as to form the second light emitting diode chip group. The second light is in a red wavelength range from 605 to 650 nanometers.

In one embodiment, the third light is in a yellow-green wavelength range from 550 to 590 nanometers In one embodiment, the method further includes disposing a reflective layer either below the first insulating substrate or between the first insulating substrate and the second light emitting diode chip group.

In one embodiment, the method further includes electrically connecting the first light emitting diode chip group to the second light emitting diode chip group.

In the light emitting component and the manufacturing method thereof of the disclosure, because the light emitting component includes a number of light emitting diode chip groups for emitting a number of lights in different wavelength ranges and a wavelength conversion fluorescent material, the color render index and the light emitting efficiency of the light emitting component can be increased. Further, because the light emitting component is manufactured by stacking a number of light emitting diode chip groups for emitting a number of lights in different wavelength ranges, the optical density and the components assembling density of the light emitting component can be increased. In addition, the miniature light emitting diodes chips are electrically connected to each other in series. Thus, the light emitting component can be driven by a high driving voltage.

BRIEF DESCRIPTION OF THE DRAWINGS

The above objects and advantages of the disclosure will become more readily apparent to those ordinarily skilled in the art after reviewing the following detailed description and accompanying drawings, in which.

DETAILED DESCRIPTION OF PREFERRED EMBODIMENTS

The disclosure will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
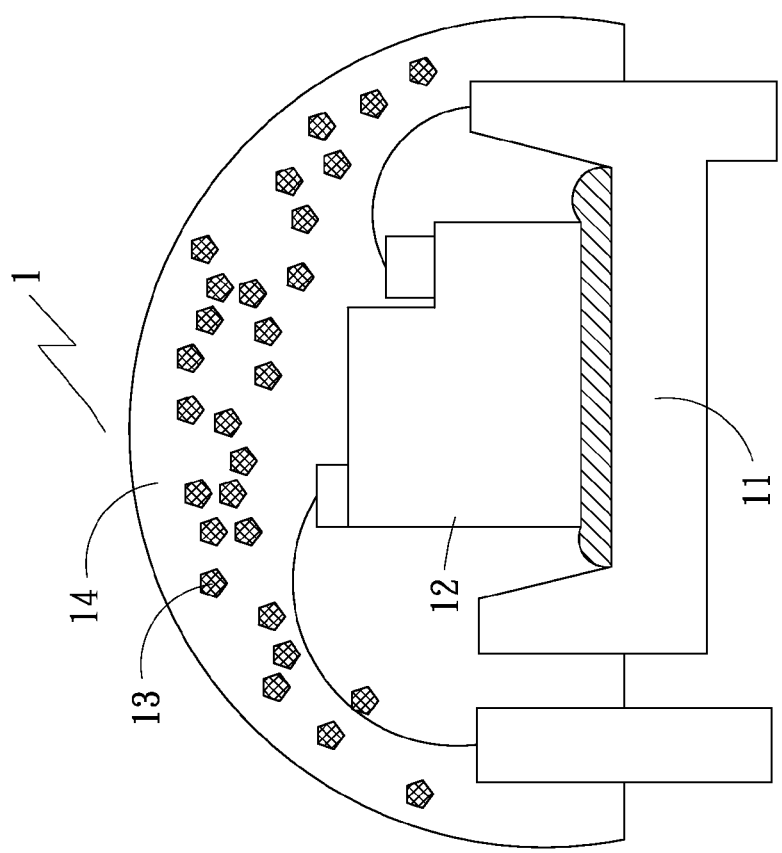
FIG. 1 illustrates a schematic view of a conventional white light emitting component.
Figure 2:
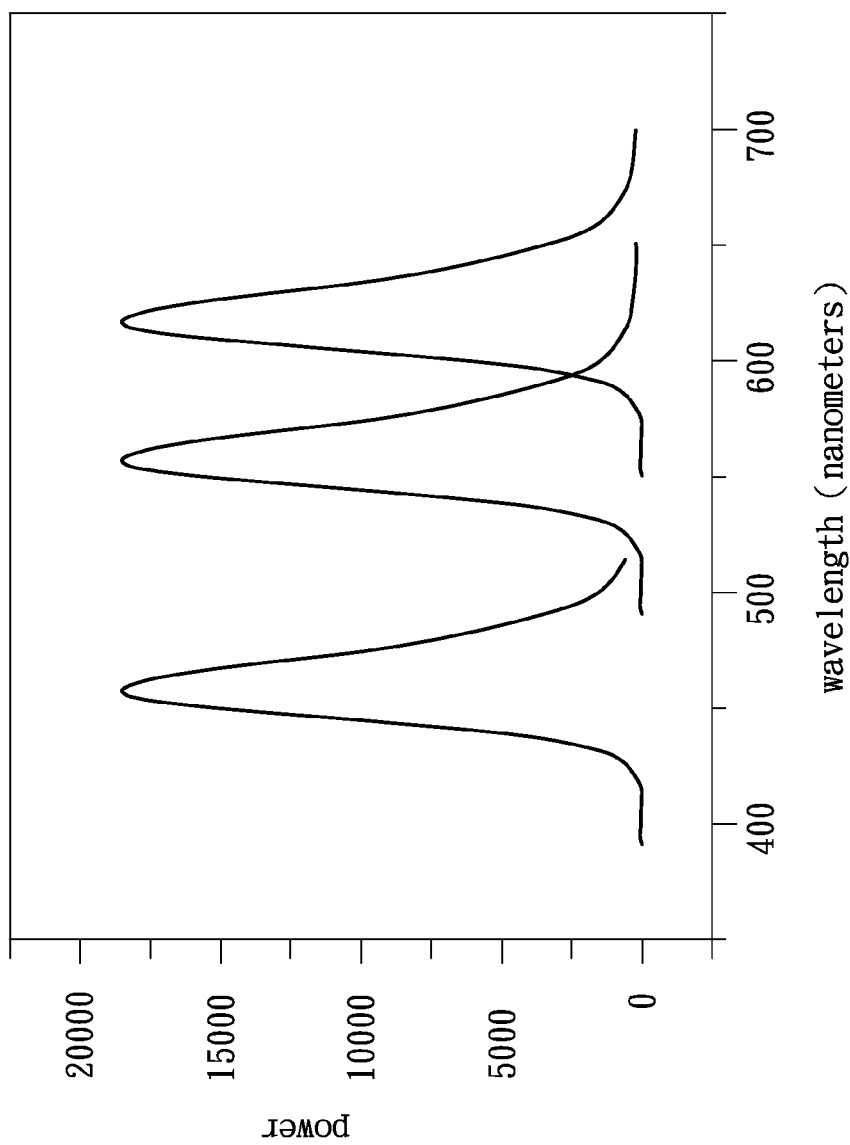
FIG. 2 illustrates a spectrogram of another conventional white light emitting component.
Figure 3:
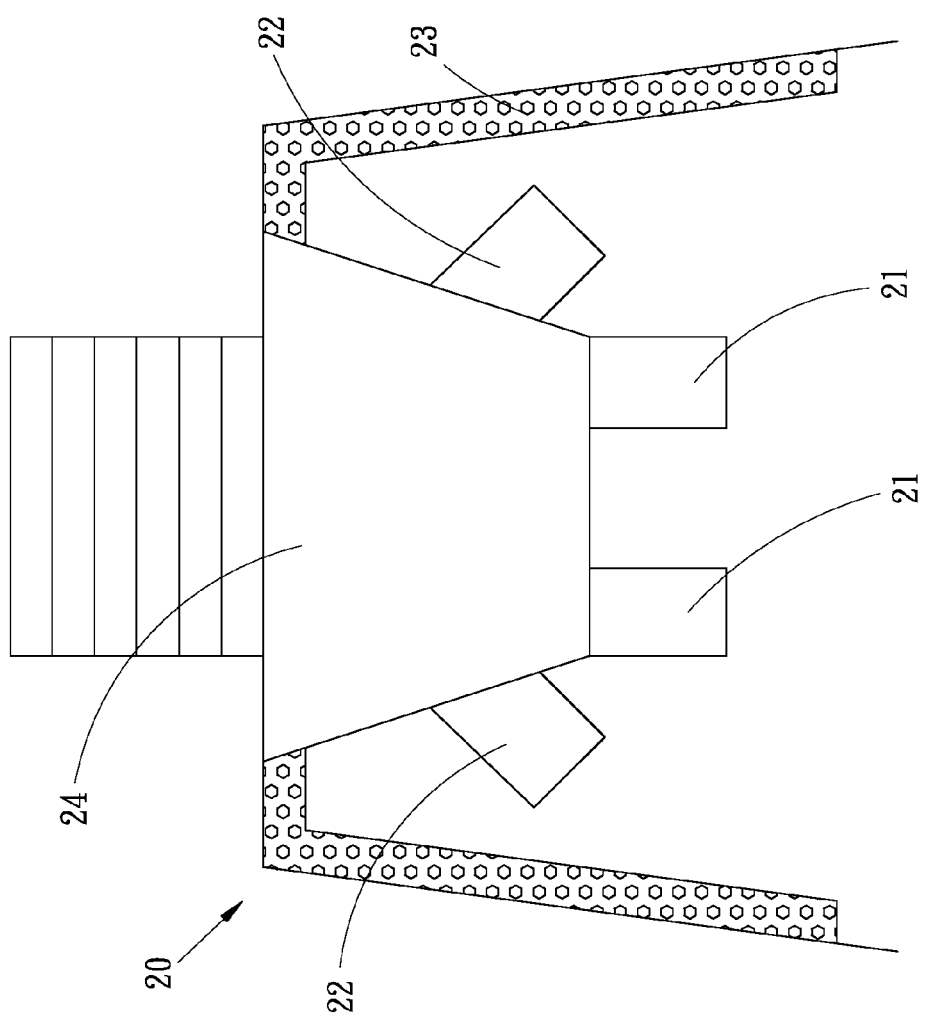
FIG. 3 illustrates a schematic view of still another conventional white light emitting component.
Figure 4:
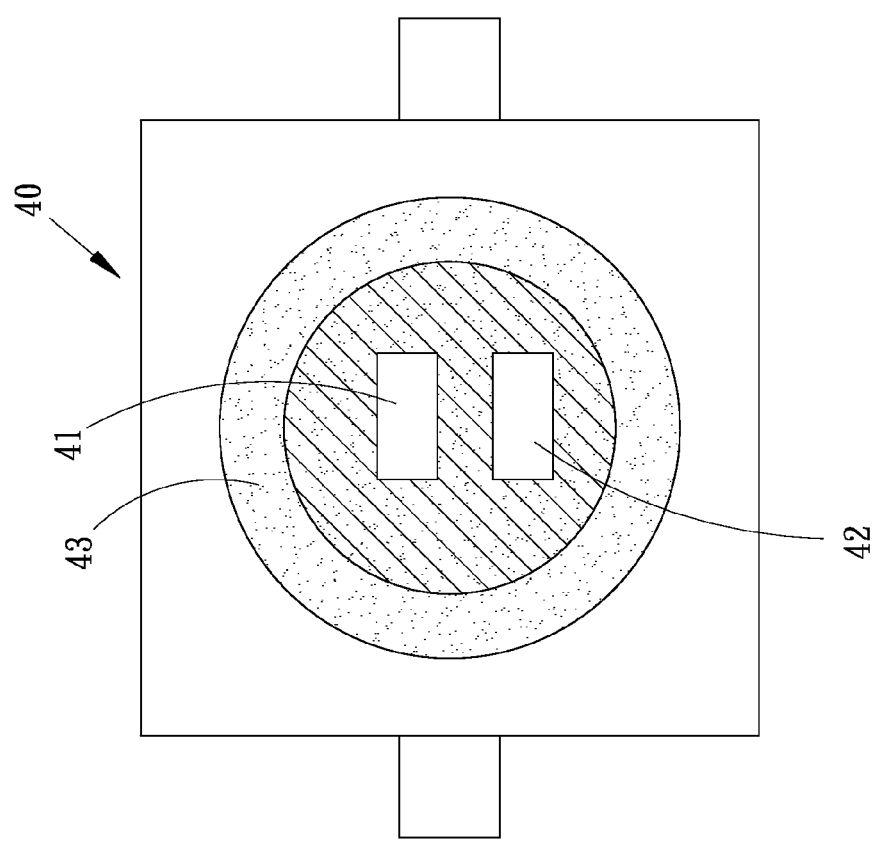
FIG. 4 illustrates a schematic view of a conventional white light emitting component driven by an AC power.
Figure 5:
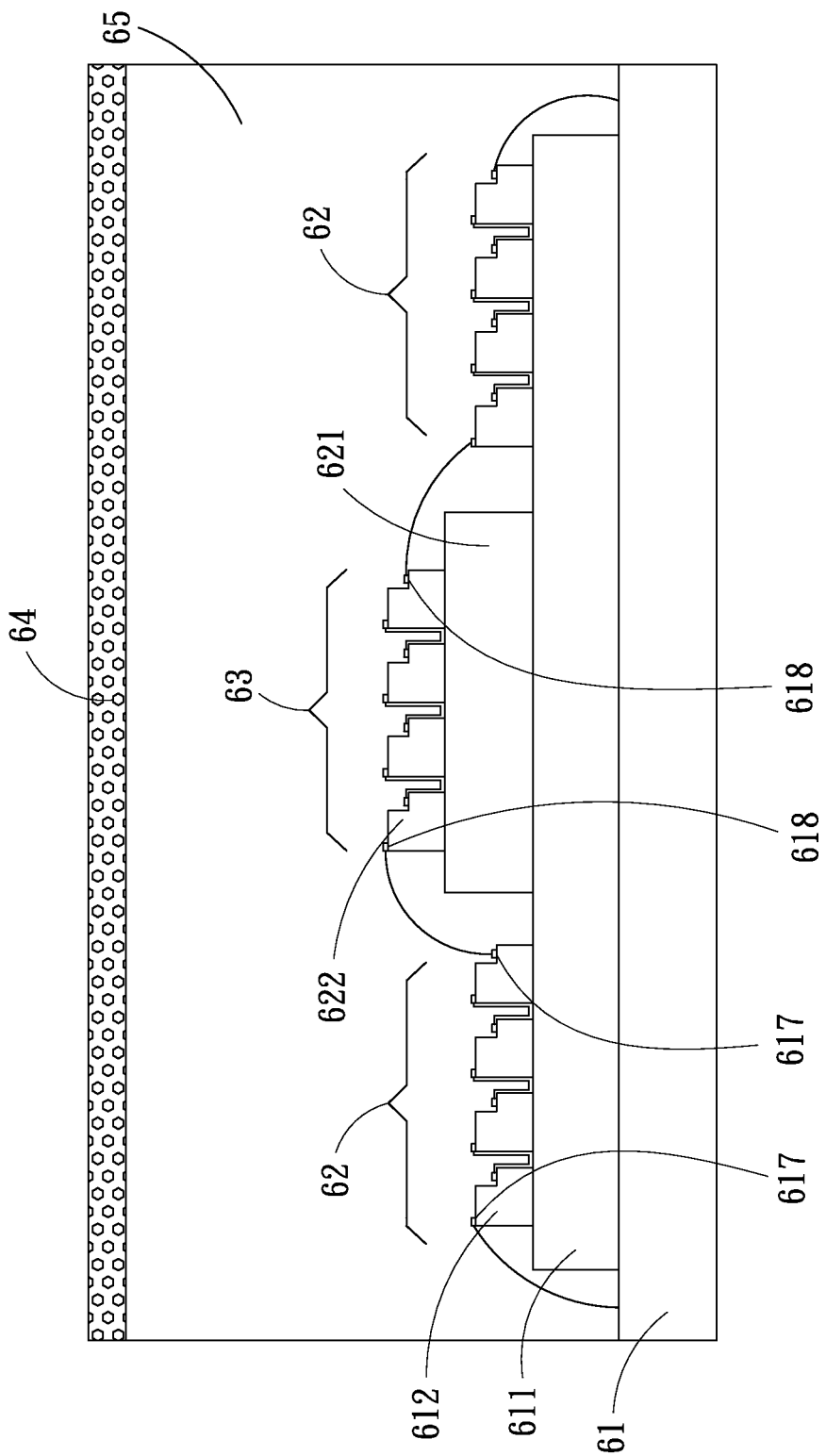
FIG. 5 illustrates a schematic view of a light emitting component in accordance with a first embodiment of the disclosure.

FIG. 5 illustrates a schematic view of a light emitting component in accordance with a first embodiment of the disclosure. Referring to FIG. 5, a light emitting component includes a leadframe 61, a first light emitting diode chip group 62, a second light emitting diode chip group 63, a wavelength conversion fluorescent material 64 and a coating resin 65. In the present embodiment, the coating resin 65 covers the first light emitting diode chip group 62 and the second light emitting diode chip group 63. The wavelength conversion fluorescent material 64 is disposed on the coating resin 65. That is, the wavelength conversion fluorescent material 64 is also disposed on the first light emitting diode chip group 62 and the second light emitting diode chip group 63. In another embodiment, the wavelength conversion fluorescent material 64 can be mixed into the coating resin 65. The coating resin 65 mixed with the wavelength conversion fluorescent material 64 is disposed on and covers the first light emitting diode chip group 62 and the second light emitting diode chip group 63. The wavelength conversion fluorescent material 64 is configured for absorbing a part of a first light emitting from the first light emitting diode chip group 62 to convert to emit a third light. A wavelength range of the first light and a wavelength range of the third light are different. The first light emitting diode chip group 62 includes a number of miniature light emitting diodes chips, which is made of an aluminum indium gallium nitride based (AlInGaN-based) epitaxial layer 612 formed on a first insulating substrate 611. A positive electrode and a negative electrode of each of the miniature light emitting diodes chips of the first light emitting diode chip group 62 are located at a common side. Further, the positive electrode and the negative electrodes of the miniature light emitting diodes chips of the first light emitting diode chip group 62 are electrically connected each other in series. Thus, the first light emitting diode chip group 62 includes at least a pair of positive and negative electrode bonding pads 617 for electrically connected to other component. The second light emitting diode chip group 63 is configured for emitting a second light. The second light emitting diode chip group 63 includes a number of miniature light emitting diodes chips, which is made of an aluminum indium gallium phosphide nitride based (AlInGaPN-based) epitaxial layer 622 formed on a second insulating substrate 621. A positive electrode and a negative electrode of each of the miniature light emitting diodes chips of the second light emitting diode chip group 63 are located at a common side. Further, the positive electrode and the negative electrodes of the miniature light emitting diodes chips of the second light emitting diode chip group 63 are electrically connected each other in series. Thus, the second light emitting diode chip group 63 includes at least a pair of positive and negative electrode bonding pads 618 for electrically connected to other components. Additionally, the second light emitting diode chip group 63 is stacked with the first light emitting diode chip group 62 in a manner such that the second insulating substrate 621 adheres to the first insulating substrate 611 and the first light emitting diode chip group 62 is electrically connected to the second light emitting diode chip group 63 in series through the positive and negative electrode bonding pads 617 and positive and negative electrode bonding pads 618. It is noted that, it is not necessary to electrically connect the first light emitting diode chip group 62 to the second light emitting diode chip group 63 in series. The first light emitting diode chip group 62 and the second light emitting diode chip group 63 can be driven and controlled respectively.

Figure 6A:
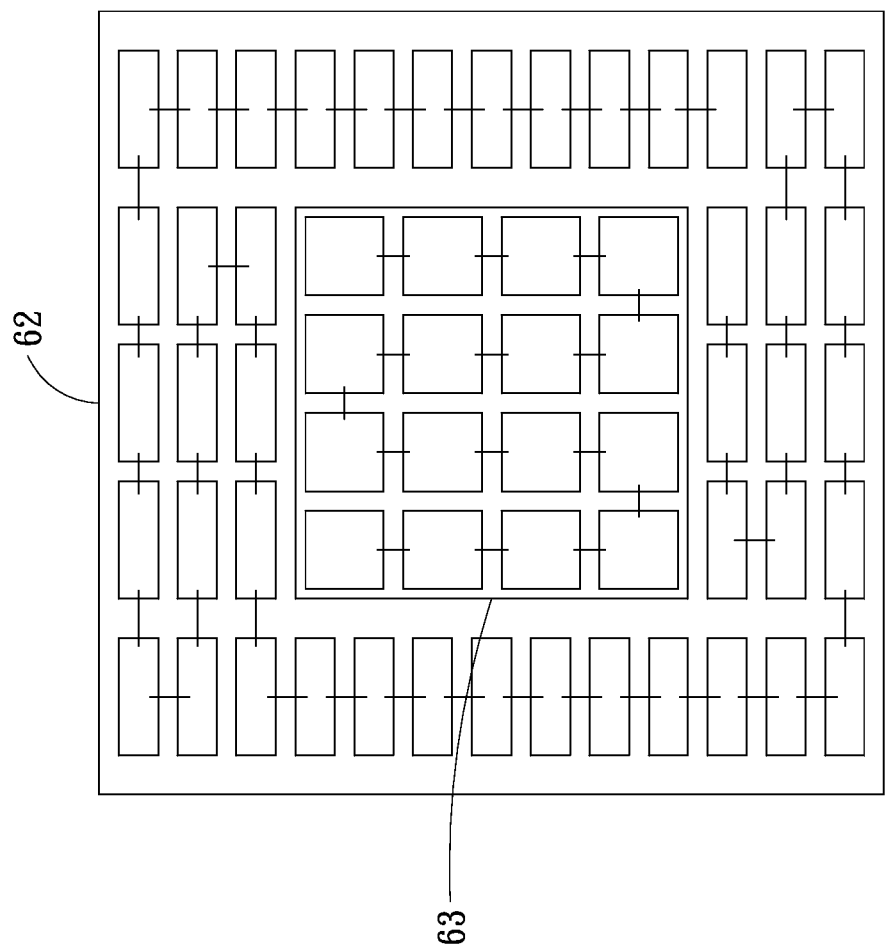
FIGS. 6(a) to 6(c) illustrate top views of the light emitting component in accordance with the first embodiment of the disclosure, which show different distributions of a first region and a second region.
Figure 6B:
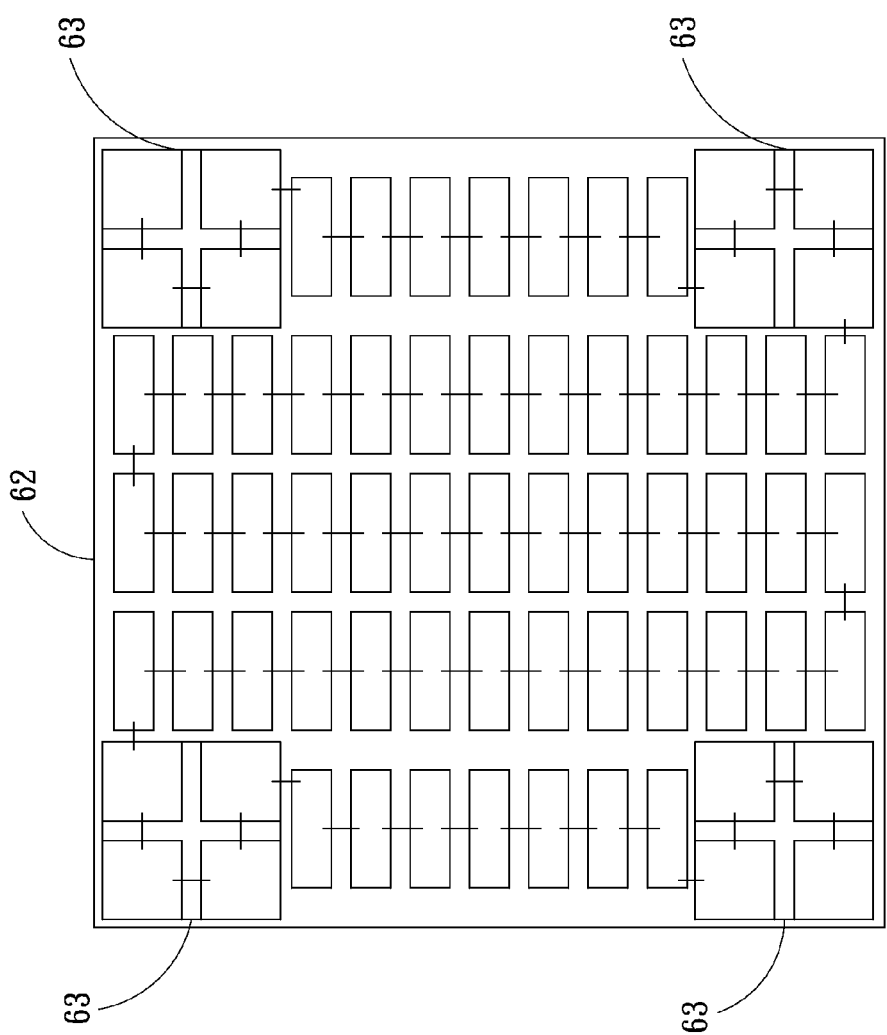
Figure 6C:
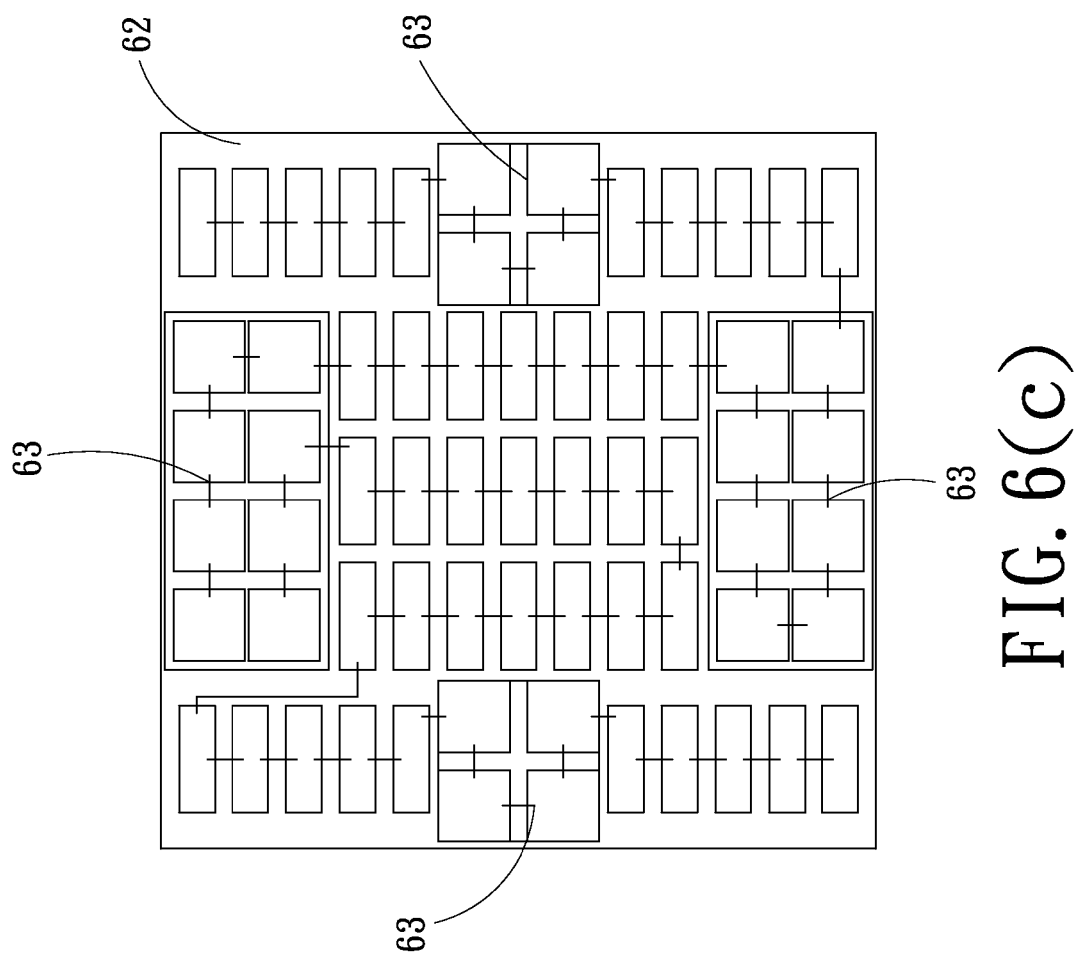

The first insulating substrate 611 is disposed on the leadframe 61. The first insulating substrate 611 has a quadrangular configuration. The first insulating substrate 611 includes a first region (not labeled) and a second region (not labeled). The second region is a defined region for stacking the second light emitting diode chip group 63. Referring to FIGS. 6(a) to 6(c), the second region can be, for example, a center region of the first insulating substrate 611, four corner regions of the first insulating substrate 611 or four periphery regions the first insulating substrate 611. It is noted that, the second region is symmetrical. A process of stacking the second light emitting diode chip group 63 with the first light emitting diode chip group 62 includes the following steps. At first, the AlInGaN-based epitaxial layer 612 is etched so as to remove a portion of the AlInGaN-based epitaxial layer 612 to expose a portion of the first insulating substrate 611, thereby defining the second region. An adhesive material is then disposed on the exposed first insulating substrate 611 in the second region. Next, the second insulating substrate 621 is attached to the exposed first insulating substrate 611 in the second region. Next, a thermal treatment is applied to the adhesive material so as to cure the adhesive material. Thus, the second insulating substrate 621 adheres to the first insulating substrate 611 through the adhesive material, and the second light emitting diode chip group 63 is disposed on the first insulating substrate 611 and located in the second region, and is stacked with the first light emitting diode chip group 62. A material of the leadframe 61 can be selected from a group consisting of ceramic based compound, aluminum nitride based (AlN-based) compound, copper, aluminum, molybdenum, tungsten, alumina based (AlO-based) compound and a composite compound comprised of at least two of the aforesaid compounds. The wavelength conversion fluorescent material 64 can be selected from a group consisting of $Sr_{1-x-y}Ba_xCa_ySiO_4$: $Eu^{2+}F$; $(Sr_{1-x-y}Eu_xMn_y)P_{2+z}O_7$:$Eu^{2+}F$; $(Ba, Sr, Ca)Al_2O_4$:Eu; $((Ba, Sr, Ca)(Mg, Zn))Si_2O_7$:Eu;$SrGa_2S_4$:Eu;$((Ba, Sr, Ca)_{1-x}Eu_x)(Mg, Zn)_{1-x}Mn_x)Al_{10}O_{17}$; $Ca_8Mg(SiO_4)_4Cl_2$:Eu, Mn; $((Ba, Sr, Ca, Mg)_{1-x} Eu_x)_2Si_2O_4$; $Ca_2MgSi_2O_7$:Cl; $SrSi_3O_8 \cdot 2SrCl_2$:Eu; BAM:Eu; Sr-Aluminate:Eu; Thiogallate:Eu; Chlorosilicate:Eu; Borate:Ce, Tb;$Sr_4Al_{14}O_{25}$:Eu; $YBO_3$:Ce, Tb; $BaMgAl_{10}O_{17}$:Eu, Mn; $(Sr, Ca, Ba)(Al, Ga)_2S_4$:Eu; $Ca_2MgSi_2O_7$:Cl, Eu, Mn; $(Sr, Ca, Ba, Mg)_{10}(PO4)_{6(c)}l_2$:Eu; ZnS:Cu, Al; $(Y, Gd, Tb, Lu, Yb)(Al_yGa_{1-y})_5O_{12}$:Ce; $(Sr_{1-x-y-z}Ba_xCa_yEu_z)_2SiO_4$; $(Sr_{1-a-b}Ca_bBa_c)Si_xN_yO_z$:$Eu_a$; $Sr_5(PO_4)_3Cl$:$Eu_a$ and combination of the aforesaid compounds. The wavelength conversion fluorescent material 64 can absorb a part of the first light emitting from the first light emitting diode chip group 62 to convert to emit the third light. The third light can be, for example, a yellow-green light in a wavelength range from 550 to 590 nanometers.

The light emitting component can be driven by a high power. For example, when a voltage of 3 volts is applied to each of the miniature light emitting diodes chips of the first light emitting diode chip group 62, a working current of each of the miniature light emitting diodes chips of the first light emitting diode chip group 62 is 15 milliamperes. If the first light emitting diode chip group 62 includes 30 miniature light emitting diodes chips electrically connected to each other in series, a working voltage of 90 volts can be applied to the first light emitting diode chip group 62. Thus, a working voltage applied to each of the miniature light emitting diodes chips of the first light emitting diode chip group 62 is 3 volts. Similarly, when a voltage of 2 volts is applied to each of the miniature light emitting diodes chips of the second light emitting diode chip group 63, a working current of each of the miniature light emitting diodes chips of the second light emitting diode chip group 63 is 15 milliamperes. In the condition that the second light emitting diode chip group 63 includes 15 miniature light emitting diodes chips electrically connected to each other in series, a working voltage of 30 volts can be applied to the second light emitting diode chip group 63. Thus, a working voltage applied to each of the miniature light emitting diodes chips of the second light emitting diode chip group 63 is 2 volts.

The first light emitting diode chip group 62 and the second light emitting diode chip group 63 are electrically connected to each other in series to form the light emitting component. When a working voltage of 120 volts is applied to the light emitting component, the first light emitting diode chip group 62 can emit the first light in a blue wavelength range from 430 to 490 nanometers, and the second light emitting diode chip group 63 can emit the second light in a red wavelength range from 605 to 650 nanometers. In other words, the first light emitting diode chip group 62, the second light emitting diode chip group 63 and the wavelength conversion fluorescent material 64 can respectively emit the first light, the second light and the third light with different wavelength ranges. A wavelength range of the first light is from 430 to 490 nanometers, a wavelength range of the second light is from 605 to 650 nanometers and a wavelength range of the third light is from 550 to 590 nanometers. Thus, the white light emitting component with high light emitting efficiency, high driving voltage, high color render index.

Figure 7:
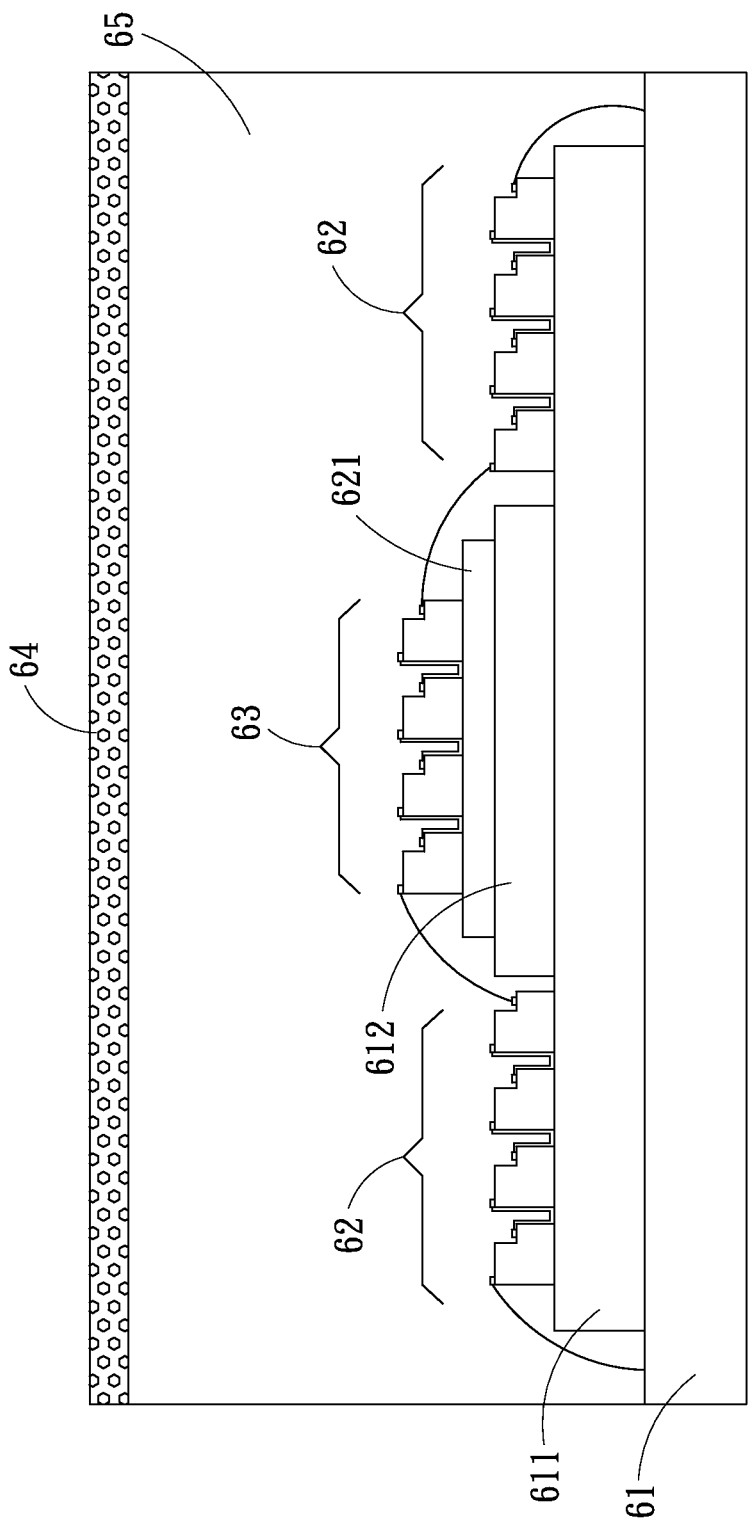
FIG. 7 illustrates a schematic view of a light emitting component in accordance with a second embodiment of the disclosure.

FIG. 7 illustrates a schematic view of a light emitting component in accordance with a second embodiment of the disclosure. Referring to FIG. 7, a light emitting component in the second embodiment is similar to the light emitting component in the first embodiment except that the AlInGaN-based epitaxial layer 612 in the second region of the first insulating substrate 611 is not etched. In other words, the second light emitting diode chip group 63 is stacked and disposed on a surface of the AlInGaN-based epitaxial layer 612 in the second region. The AlInGaN-based epitaxial layer 612 in the second region does not form the miniature light emitting diodes chips. In detail, a transparent adhesive material is disposed on the surface of the AlInGaN-based epitaxial layer 612 in the second region of the first insulating substrate 611. Next, the second insulating substrate 621 is attached to the surface of the AlInGaN-based epitaxial layer 612 in the second region. Next, a thermal treatment is applied to the transparent adhesive material so as to cure the transparent adhesive material. Thus, the second insulating substrate 621 adheres to the AlInGaN-based epitaxial layer 612 in the second region through the transparent adhesive material, and the second light emitting diode chip group 63 is disposed on the first insulating substrate 611 and located in the second region, and is stacked with the first light emitting diode chip group 62.

Figure 8:
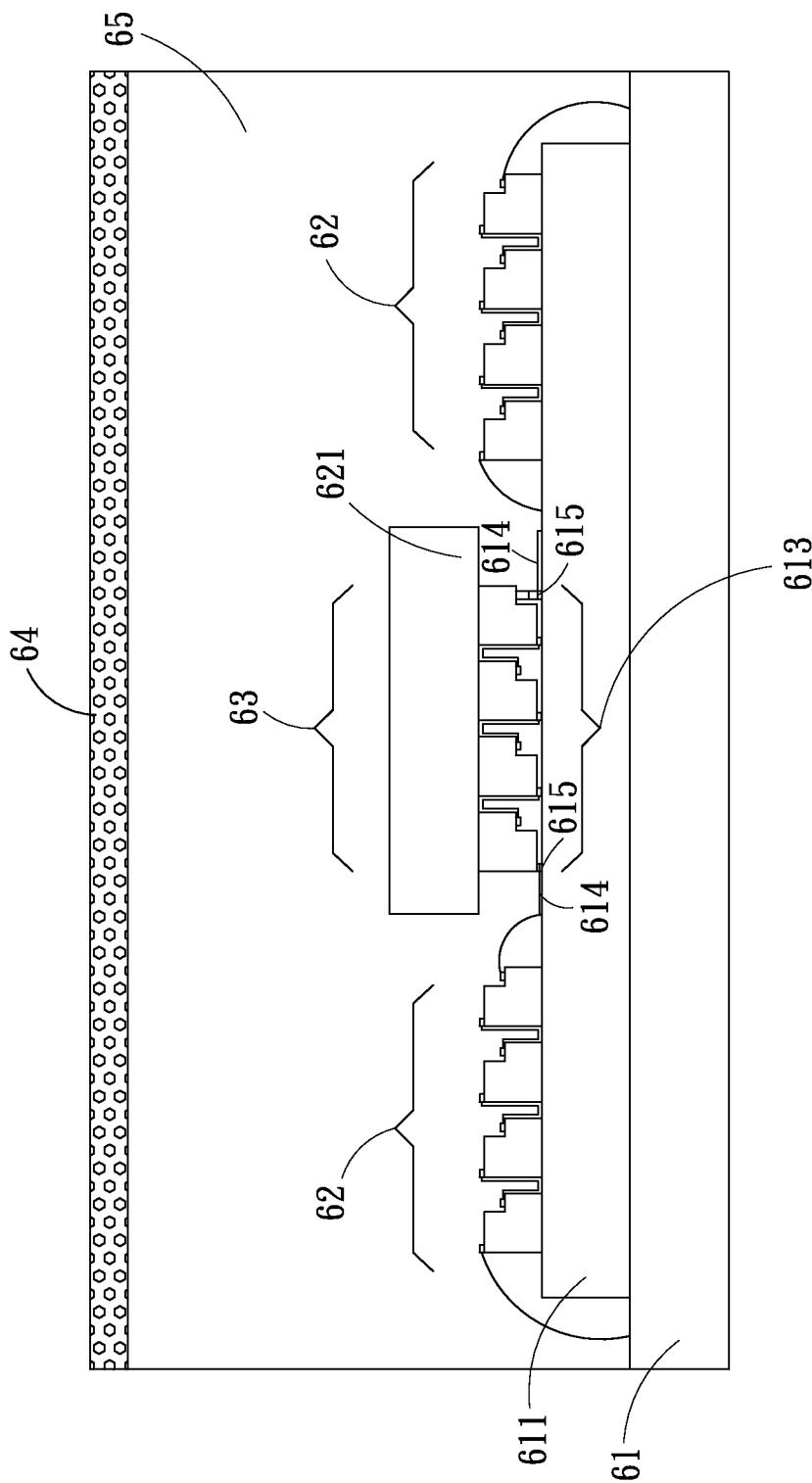
FIG. 8 illustrates a schematic view of a light emitting component in accordance with a third embodiment of the disclosure.

FIG. 8 illustrates a schematic view of a light emitting component in accordance with a third embodiment of the disclosure. Referring to FIG. 8, a light emitting component in the third embodiment is similar to the light emitting component in the first embodiment except that the second light emitting diode chip group 63 is stacked with the first light emitting diode chip group 62 in a flip-chip manner. A flip-chip region 613 is the second region of the first insulating substrate 611 for stacking the second light emitting diode chip group 63. The flip-chip region 613 can be, for example, a center region of the first insulating substrate 611, four corner regions of the first insulating substrate 611 or four periphery regions the first insulating substrate 611. It is noted that, the second region is symmetrical. A process of stacking the second light emitting diode chip group 63 with the first light emitting diode chip group 62 in the flip-chip manner includes the following steps. At first, the AlInGaN-based epitaxial layer 612 is etched so as to remove a portion of the AlInGaN-based epitaxial layer 612 to expose a portion of the first insulating substrate 611, thereby defining the flip-chip region 613. And then, a number of metal traces 614 and metal pads 615 are formed on the exposed first insulating substrate 611 in the flip-chip region 613. Next, the pair of positive and negative electrode bonding pads (numeral 618 as show in FIG. 5) of the second light emitting diode chip group 63 is bonded to the metal pads 615 on the first insulating substrate 611. Thus, the second light emitting diode chip group 63 is stacked with the first light emitting diode chip group 62 in the flip-chip manner. The second insulating substrate 621 is a transparent substrate. In the present embodiment, the second light emitting diode chip group 63 emits the second light through the second insulating substrate 621. In other words, the second insulating substrate 621 has a surface for serving as a light emitting surface.

Figure 9:
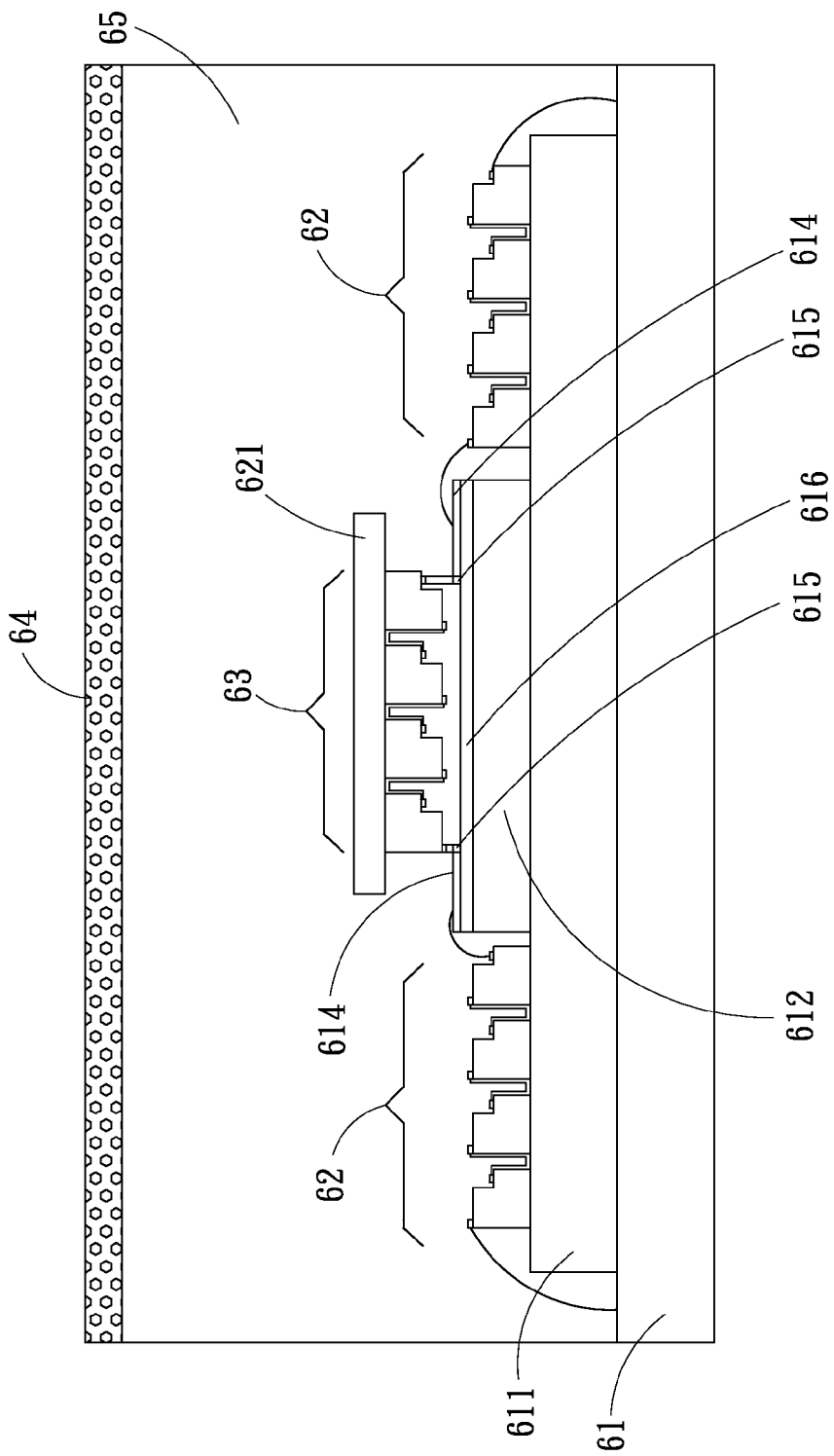
FIG. 9 illustrates a schematic view of a light emitting component in accordance with a fourth embodiment of the disclosure.

FIG. 9 illustrates a schematic view of a light emitting component in accordance with a fourth embodiment of the disclosure. Referring to FIG. 9, a light emitting component in the fourth embodiment is similar to the light emitting component in the second embodiment except that the second light emitting diode chip group 63 is stacked with the first light emitting diode chip group 62 in a flip-chip manner. A flip-chip region 613 is the second region of the first insulating substrate 611 for stacking the second light emitting diode chip group 63. The flip-chip region 613 can be, for example, a center region of the first insulating substrate 611, four corner regions of the first insulating substrate 611 or four periphery regions the first insulating substrate 611. It is noted that, the second region is symmetrical. The AlInGaN-based epitaxial layer 612 in the flip-chip region 613 does not form the miniature light emitting diodes chips. A process of stacking the second light emitting diode chip group 63 with the first light emitting diode chip group 62 in the flip-chip manner includes the following steps. At first, an insulating layer 616 is formed a surface of the AlInGaN-based epitaxial layer 612 in the flip-chip region 613. And then, a number of metal traces 614 and metal pads 615 are formed on the insulating layer 616. Next, the pair of positive and negative electrode bonding pads (numeral 618 as show in FIG. 5) of the second light emitting diode chip group 63 is bonded to the metal pads 615 on the insulating layer 616. Thus, the second light emitting diode chip group 63 is stacked with the first light emitting diode chip group 62 in the flip-chip manner.

Figure 10:
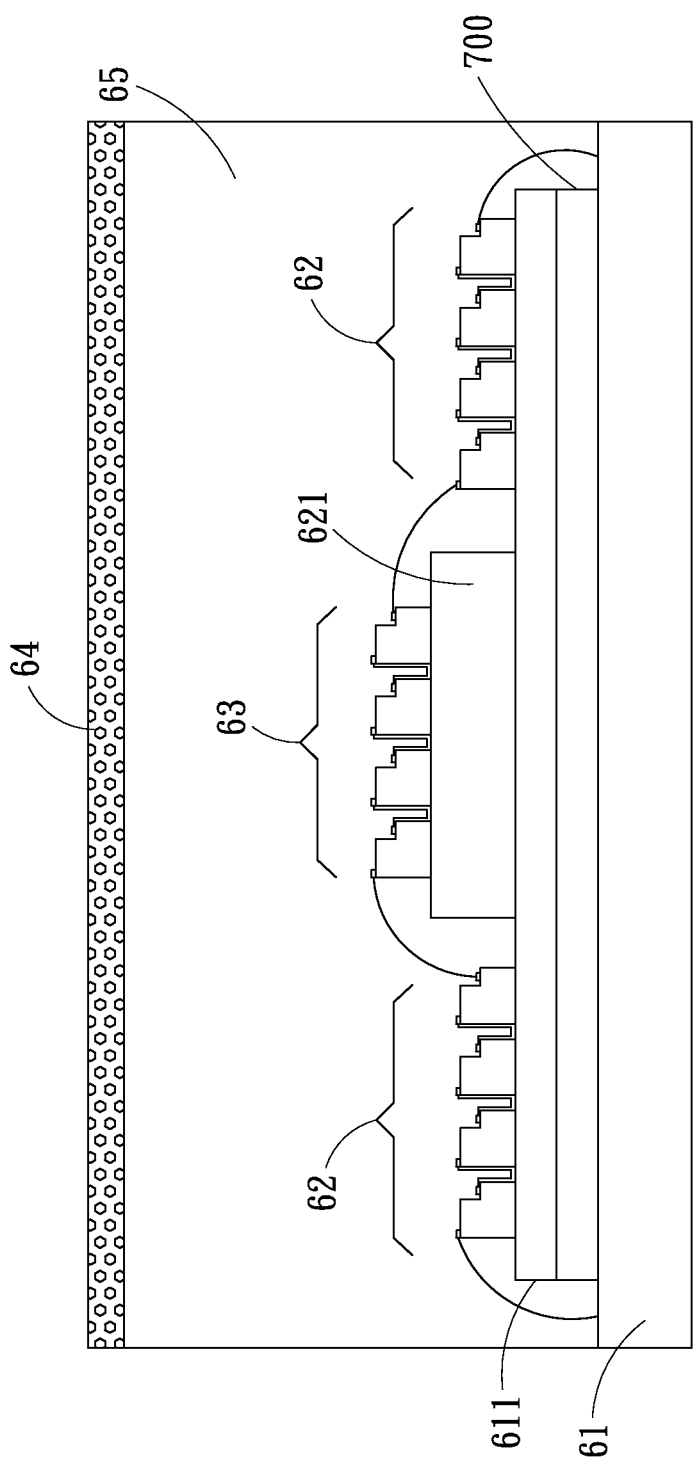
FIG. 10 illustrates a schematic view of a light emitting component in accordance with a fifth embodiment of the disclosure.

FIG. 10 illustrates a schematic view of a light emitting component in accordance with a fifth embodiment of the disclosure. Referring to FIG. 10, a light emitting component in the fifth embodiment is similar to the light emitting components in the first and second embodiment except a reflective layer 700. In the present embodiment, the reflective layer 700 is disposed a side of the first insulating substrate where the first light emitting diode chip group 62 does not disposed. In other words, the reflective layer 700 is disposed below the first light emitting diode chip group 62 and the second light emitting diode chip group 63. The reflective layer 700 is configured for reflecting the light emitting from the first light emitting diode chip group 62, the second light emitting diode chip group 63 and the wavelength conversion fluorescent material 64 to emit the reflected light from a light emitting surface of the wavelength conversion fluorescent material 64. The reflective layer 700 can be selected from a group consisting of a metal reflector, an omnidirectional reflector, a distributed bragg reflector, an optical crystal reflector and a combination of the aforesaid reflectors. A reflectivity of the reflective layer 700 to the visible light can be more than 95%.

Figure 11:
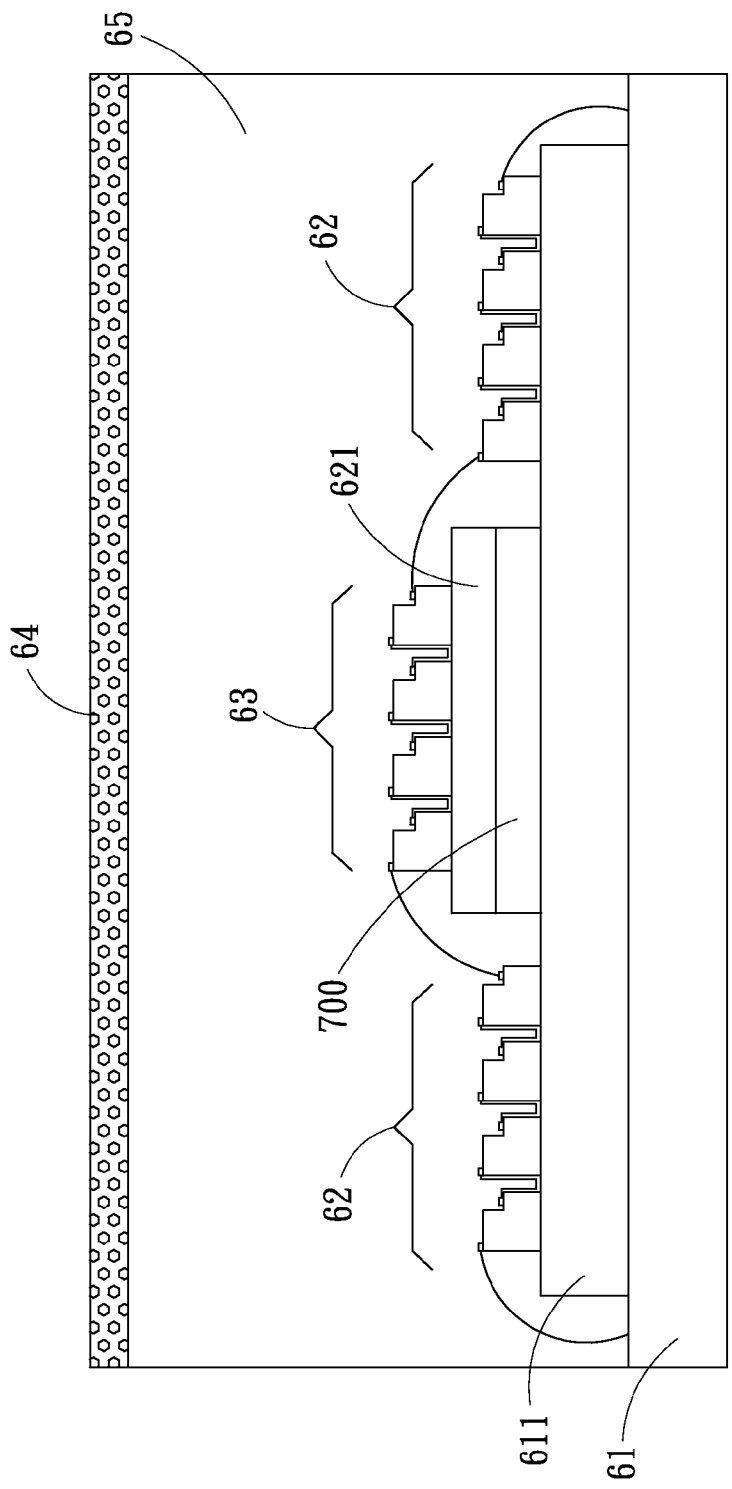
FIG. 11 illustrates a schematic view of a light emitting component in accordance with a sixth embodiment of the disclosure.

FIG. 11 illustrates a schematic view of a light emitting component in accordance with a sixth embodiment of the disclosure. Referring to FIG. 11, a light emitting component in the sixth embodiment is similar to the light emitting components in the first and second embodiment except a reflective layer 700. In the present embodiment, the reflective layer 700 is disposed a side of the second insulating substrate 621 where the second light emitting diode chip group 63 is not disposed. In other words, the reflective layer 700 is disposed between the first insulating substrate 611 and the second insulating substrate 621. The reflective layer 700 is configured for reflecting the light emitting from the second light emitting diode chip group 63 and the wavelength conversion fluorescent material 64 towards the second insulating substrate 621 so as to emit the reflected light from a light emitting surface of the wavelength conversion fluorescent material 64. The reflective layer 700 can be selected from a group consisting of a metal reflector, an omnidirectional reflector, a distributed bragg reflector, an optical crystal reflector and a combination of the aforesaid reflectors. A reflectivity of the reflective layer 700 to the visible light can be more than 95%.

Figure 12:
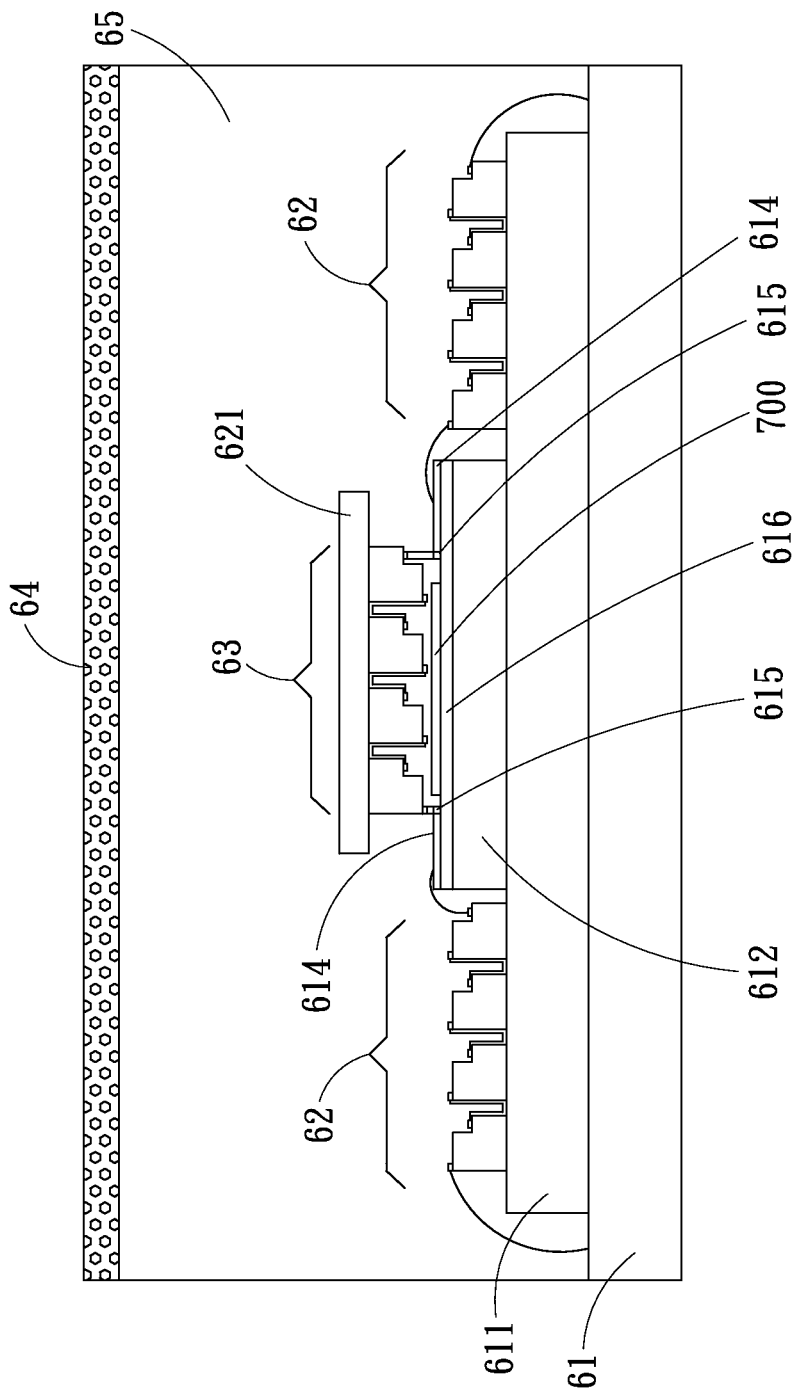
FIG. 12 illustrates a schematic view of a light emitting component in accordance with a seventh embodiment of the disclosure.

FIG. 12 illustrates a schematic view of a light emitting component in accordance with a seventh embodiment of the disclosure. Referring to FIG. 12, a light emitting component in the seventh embodiment is similar to the light emitting components in the third and fourth embodiment except a reflective layer 700. In the present embodiment, the reflective layer 700 is disposed a side of the second insulating substrate 621 where the second light emitting diode chip group 63 is disposed. In other words, the reflective layer 700 is still disposed between the first insulating substrate 611 and the second insulating substrate 621, and even between the AlInGaN-based epitaxial layer 612 and the second insulating substrate 621 and on the insulating layer 616. The reflective layer 700 is configured for reflecting the light emitting from the second light emitting diode chip group 63 and the wavelength conversion fluorescent material 64 towards the AlInGaN-based epitaxial layer 612 on the first insulating substrate 611 so as to emit the reflected light from a light emitting surface of the second insulating substrate 621. The reflective layer 700 can be selected from a group consisting of a metal reflector, an omnidirectional reflector, a distributed bragg reflector, an optical crystal reflector and a combination of the aforesaid reflectors. A reflectivity of the reflective layer 700 to the visible light can be more than 95%.

Figure 13:
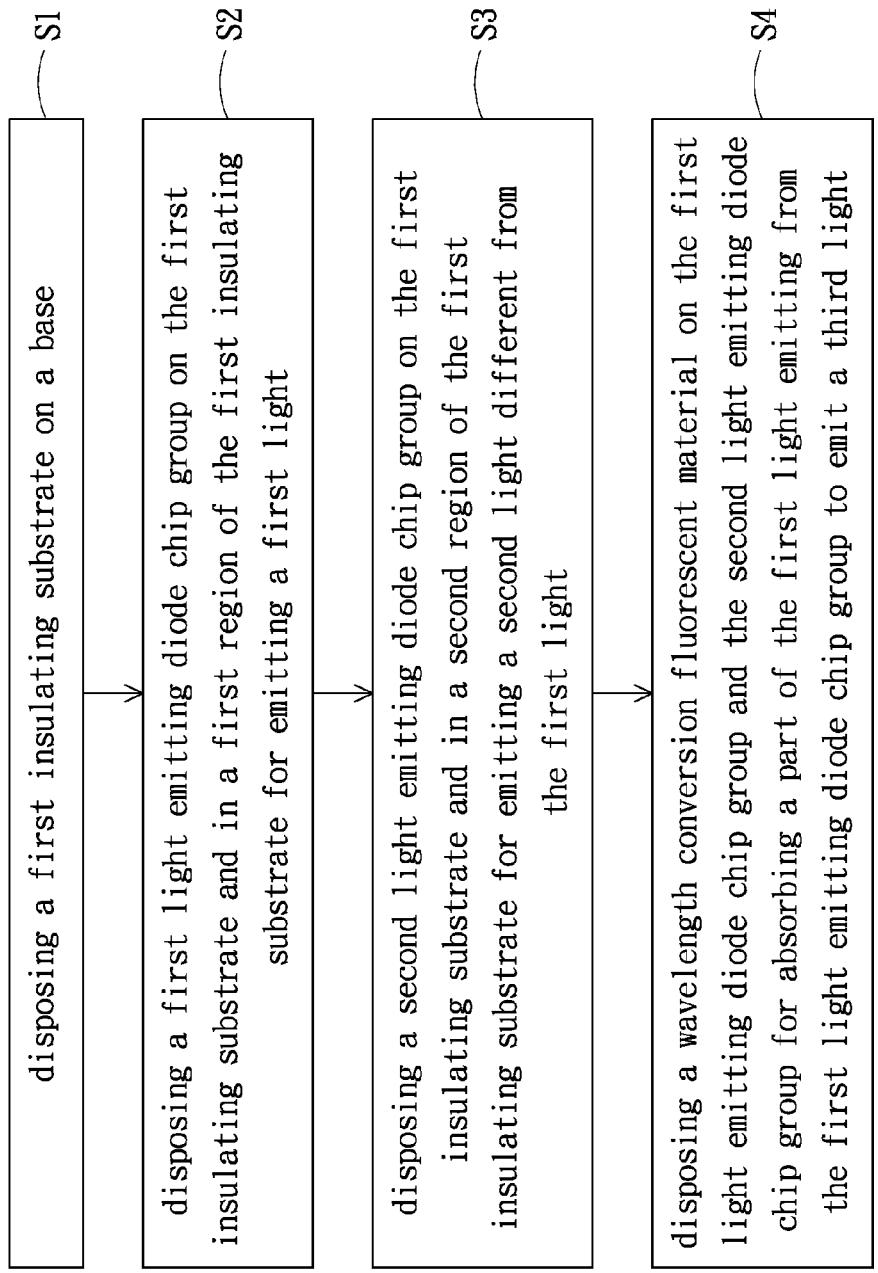
FIG. 13 illustrates a flow chart of a manufacturing method of a light emitting component of the disclosure.

FIG. 13 illustrates a flow chart of a manufacturing method of a light emitting component of the disclosure. Referring to FIG. 13, at first, a first insulating substrate is disposed on a leadframe, as shown in step S1. Then, as shown in step S2, a first light emitting diode chip group is disposed on the first insulating substrate and located in a first region of the first insulating substrate. The first light emitting diode chip group is configured for emitting a first light. Thereafter, as shown in step S3, a second light emitting diode chip group is disposed on the first insulating substrate and located in the second region of the first insulating substrate. The second light emitting diode chip group is configured for emitting a second light. A wavelength range of the first light and a wavelength range of the second light are different. Afterwards, as shown in step S4, a wavelength conversion fluorescent material is disposed on the first light emitting diode chip group and the second light emitting diode chip group. The wavelength conversion fluorescent material is configured for absorbing a part of the first light emitting from the first light emitting diode chip group to emit a third light. A wavelength range of the first light, a wavelength range of the second light and a wavelength range of the third light are different.

Figure 14:
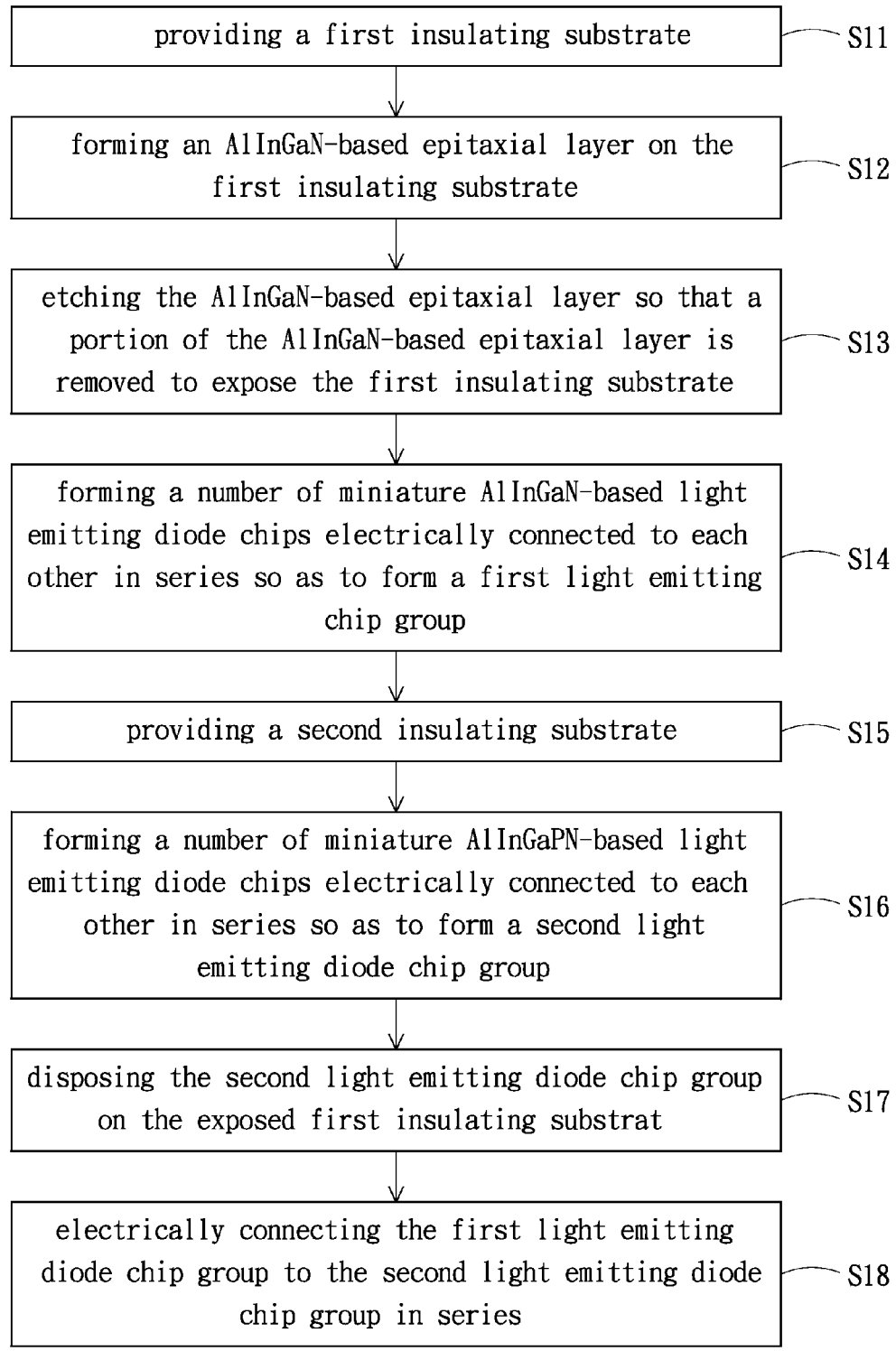
FIG. 14 illustrates a flow chart of a manufacturing method of a light emitting component in accordance with a first embodiment of the disclosure.

FIG. 14 illustrates a flow chart of a manufacturing method of a light emitting component in accordance with a first embodiment of the disclosure. Referring to FIG. 14, as shown in step S11, a first insulating substrate is provided. Next, in step S12, an AlInGaN-based epitaxial layer is formed on the first insulating substrate. Next, in step S13, the AlInGaN-based epitaxial layer is etched so that a portion of the AlInGaN-based epitaxial layer is removed to expose the first insulating substrate. Next, in step S14, a number of miniature AlInGaN-based light emitting diode chips are formed and are electrically connected to each other in series so as to form a first light emitting chip group. Next, in step S15, a second insulating substrate is provided. Next, in step S16, a number of miniature AlInGaPN-based light emitting diode chips are formed and are electrically connected to each other in series so as to form a second light emitting diode chip group. Next, in step S17, the second light emitting diode chip group is disposed on the exposed first insulating substrate. Next, in step S18, the first light emitting diode chip group is electrically connected to the second light emitting diode chip group in series.

In summary, because the light emitting component includes a number of light emitting diode chip groups for emitting a number of lights in different wavelength ranges and the wavelength conversion fluorescent material, the driving voltage and the light emitting efficiency of the light emitting component can be increased. Further, because the light emitting component includes the AlInGaN-based light emitting diode chip group, the AlInGaPN-based light emitting diode chip group and the wavelength conversion fluorescent material, the color render index and the light emitting efficiency of the light emitting component can be increased. In addition, because the light emitting component is manufactured by stacking the AlInGaN-based light emitting diode chip group with AlInGaPN-based light emitting diode chip group, the optical density and the components assembling density of the light emitting component can be increased.

While the invention has been descry bed in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A light emitting component comprising:
   a leadframe;
   a first insulating substrate disposed on the leadframe;
   a second insulating substrate, disposed on the first insulating substrate, and exposing a region of the first insulating substrate;
   a first light emitting diode chip group disposed on the region and configured to emit a first light;
   a second light emitting diode chip group disposed on the second insulating substrate at an elevation, from the leadframe, higher than that of the first light emitting diode chip group and configured to emit a second light; and
   a wavelength conversion fluorescent material disposed on the first light emitting diode chip group and the second light emitting diode chip group, the wavelength conversion fluorescent material being configured to absorb a part of the first light and emit a third light,
   wherein the first light, the second light, and the third light have different wavelength ranges.

2. The light emitting component as claimed in claim 1, wherein the first light emitting diode chip group comprises a plurality of miniature AlInGaN-based light emitting diode chips, which are electrically connected to each other in series.

3. The light emitting component as claimed in claim 1, wherein the second light emitting diode chip group is disposed on four corner regions of the first insulating substrate or four periphery regions the first insulating substrate.

4. The light emitting component as claimed in claim 1, further comprising a reflective layer disposed either below the first insulating substrate or between the first insulating substrate and the second light emitting diode chip group.

5. The light emitting component as claimed in claim 1, wherein the first light emitting diode chip group is electrically connected to the second light emitting diode chip group.

6. The light emitting component as claimed in claim 1, further comprising a plurality of metal pads disposed on the first insulating substrate, wherein the second light emitting diode chip group is disposed on the plurality of metal pads in a flip-chip manner.

7. The light emitting component as claimed in claim 1, further comprising an AlInGaN-based epitaxial layer disposed between the first insulating substrate and the second insulating substrate.

8. The light emitting component as claimed in claim 7, further comprising a reflective layer disposed between the first insulating layer and the second light emitting diode chip group.

9. The light emitting component as claimed in claim 1, further comprising a coating resin covering the first light emitting diode chip group and the second light emitting diode chip group,
   wherein the coating resin is disposed between the wavelength conversion fluorescent material and the first light emitting diode chip group.

10. The light emitting component as claimed in claim 1, wherein the wavelength conversion fluorescent material is selected from a group consisting of $Sr_{1-x-y}Ba_xCa_ySiO_4:Eu^{2+}F$; $(Sr_{1-x-y}Eu_xMn_y)P_{2+z}O_7:Eu.^{2+}F$;$(Ba, Sr, Ca) Al_2O_4:Eu$; $((Ba, Sr, Ca)(Mg, Zn))Si_2O_7:Eu$; $SrGa_2S_4:Eu$;$((Ba, Sr, Ca)_{1-x}Eu_x)(Mg, Zn)_{1-x}Mn_x)Al_{10}O_{17}$; $Ca_8Mg(SiO_4)_4Cl_2:Eu, Mn$; $((Ba, Sr, Ca, Mg)_{1-x}Eu_x)_2Si_2O_4$; $Ca_2MgSi_2O_7:Cl$; $SrSi_3O_8 2SrCl_2:Eu$; BAM:Eu; Sr-Aluminate:Eu; Thiogallate:Eu; Chlorosilicate:Eu; Borate:Ce, Tb;$Sr_4Al_{14}O_{25}:Eu$;$YBO_3$:Ce, Tb; $BaMgAl_{10}O_{17}:Eu, Mn$; $(Sr, Ca, Ba)(Al, Ga)_2S_4:Eu$; $Ca_2MgSi_2O_7:Cl, Eu, Mn$; $(Sr, Ca, Ba, Mg)_{10}(PO4)_6(c)l_2:Eu$; ZnS:Cu, Al; $(Y, Gd, Tb, Lu, Yb)(Al_yGa_{1-y})_5O_{12}:Ce$; $(Sr_{1-x-y-z}Ba_xCa_yEu_z)_2SiO_4$; $(Sr_{1-a-b}Ca_bBa_c)Si_xN_yO_z:Eu_a$; $Sr_5(PO_4)_3Cl:Eu_a$ and a combination of the aforesaid compounds.

11. The light emitting component as claimed in claim 1, wherein the first light emitting diode chip group comprises a first epitaxial layer directly contacting the first insulating substrate.

12. The light emitting component as claimed in claim 1, wherein the second insulating substrate is excluded from extending between the first light emitting diode chip group and the first insulating substrate.

13. The light emitting component as claimed in claim 1, wherein the second insulating substrate is arranged in an area substantially similar to an outermost boundary of the second light emitting diode chip group.

* * * * *